United States Patent
Yeh et al.

(10) Patent No.: US 8,629,515 B2
(45) Date of Patent: Jan. 14, 2014

(54) METAL GATE SEMICONDUCTOR DEVICE

(75) Inventors: Ching-Han Yeh, Taninan (TW);
Chen-Pin Hsu, Taoyuan (TW);
Ming-Yuan Wu, Hsinchu (TW);
Kong-Beng Thei, Pao-Shan Village (TW); Harry Chuang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/245,494

(22) Filed: Sep. 26, 2011

(65) Prior Publication Data

US 2012/0012948 A1 Jan. 19, 2012

Related U.S. Application Data

(62) Division of application No. 12/477,618, filed on Jun. 3, 2009, now Pat. No. 8,039,381.

(60) Provisional application No. 61/096,633, filed on Sep. 12, 2008, provisional application No. 61/109,317, filed on Oct. 29, 2008.

(51) Int. Cl.
*H01L 29/78* (2006.01)
(52) U.S. Cl.
USPC .................. 257/412; 257/249; 257/E29.197
(58) Field of Classification Search
USPC .......... 257/240, E29.095, E29.169, E29.187, 257/E29.197, 249, 412
See application file for complete search history.

(56) References Cited

U.S. PATENT DOCUMENTS

| | | | |
|---|---|---|---|
| 5,895,261 A | 4/1999 | Schinella et al. | |
| 6,376,888 B1 | 4/2002 | Tsunashima et al. | |
| 6,653,698 B2 * | 11/2003 | Lee et al. | 257/407 |
| 6,797,572 B1 * | 9/2004 | Jeon et al. | 438/287 |
| 6,861,350 B1 | 3/2005 | Ngo et al. | |
| 7,745,889 B2 | 6/2010 | Lin et al. | |
| 2003/0119292 A1 * | 6/2003 | Lee et al. | 438/596 |
| 2003/0227092 A1 | 12/2003 | Liu et al. | |
| 2004/0135212 A1 * | 7/2004 | Dokumaci et al. | 257/376 |
| 2005/0153530 A1 * | 7/2005 | Ku et al. | 438/587 |
| 2005/0158935 A1 * | 7/2005 | Shin et al. | 438/197 |
| 2005/0221548 A1 * | 10/2005 | Doyle et al. | 438/197 |
| 2006/0035425 A1 * | 2/2006 | Carter et al. | 438/199 |

(Continued)

FOREIGN PATENT DOCUMENTS

JP 2001267561 9/2001

OTHER PUBLICATIONS

Chinese Patent Office, Office Action dated Mar. 29, 2011, Application No. 200910169144.9, 9 pages.

*Primary Examiner* — Caridad Everhart
(74) *Attorney, Agent, or Firm* — Haynes and Boone, LLP

(57) ABSTRACT

A semiconductor device includes a semiconductor substrate, a source and a drain region formed on the semiconductor substrate, and a gate structure disposed on the substrate between the source and drain regions. The gate structure includes an interfacial layer formed over the substrate, a high-k dielectric formed over the interfacial layer, and a metal gate formed over the high-k dielectric that includes a first metal layer and a second metal layer, where the first metal layer is formed on a portion of the sidewalls of the gate structure and where the second metal layer is formed on another portion of the sidewalls of the gate structure.

19 Claims, 7 Drawing Sheets

(56) References Cited

U.S. PATENT DOCUMENTS

| | | |
|---|---|---|
| 2006/0051880 A1 | 3/2006 | Doczy et al. |
| 2006/0051915 A1* | 3/2006 | Kadoshima et al. .......... 438/216 |
| 2006/0071282 A1* | 4/2006 | Kadoshima et al. .......... 257/369 |
| 2006/0166447 A1 | 7/2006 | Doczy et al. |
| 2007/0037343 A1* | 2/2007 | Colombo et al. ............. 438/231 |
| 2007/0262451 A1* | 11/2007 | Rachmady et al. ........... 257/758 |
| 2008/0179714 A1 | 7/2008 | Chou et al. |
| 2009/0001480 A1* | 1/2009 | Cheng .......................... 257/387 |
| 2009/0142899 A1 | 6/2009 | Jensen et al. |
| 2009/0275179 A1* | 11/2009 | Basker et al. ................. 438/231 |
| 2009/0280631 A1 | 11/2009 | Gambino et al. |
| 2010/0140717 A1 | 6/2010 | Lavoie et al. |

* cited by examiner

METAL GATE SEMICONDUCTOR DEVICE

PRIORITY DATA

This application is a divisional application of U.S. application Ser. No. 12/477,618 filed Jun. 3, 2009, now U.S. Pat. No. 8,039,381, which claims priority to Provisional Application Ser. No. 61/096,633 filed on Sep. 12, 2008, entitled "Photoresist Etch Back Method For Gate Last Process," and to Provisional Application Ser. No. 61/109,317 filed on Oct. 29, 2008, entitled "Photoresist Etch Back Method For Gate Last Process," the disclosures of which are incorporated herein by reference.

BACKGROUND

The present disclosure relates generally a semiconductor device and, more particularly, to a gate structure and method of forming a gate structure of a semiconductor device.

As technology nodes shrink, in some IC designs, there has been a desire to replace the typically polysilicon gate electrode with a metal gate electrode to improve device performance with the decreased feature sizes. Providing metal gate structures (e.g., including a metal gate electrode rather than polysilicon) offers one solution. One process of forming a metal gate stack is termed "gate last" process in which the final gate stack is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high dielectric constant (high-k) gate insulator layers are also used which allow greater physical thicknesses while maintaining the same effective thickness as would be provided by a typical gate oxide used in larger technology nodes.

There are challenges to implementing such features and processes in CMOS fabrication however. As the gate lengths decrease, these problems are exacerbated. For example, in a "gate last" fabrication process, voiding can occur when depositing a metal film into a trench to from the metal gate electrode. As gate lengths decrease, the trench also decreases in size, and depositing metal into the trench becomes increasingly difficult, and increasingly likely to form a void.

SUMMARY

One of the broader forms of an embodiment of the invention involves a method for fabricating a semiconductor device. The method includes providing a substrate including a dummy gate structure formed thereon, removing the dummy gate structure to form a trench, forming a first metal layer over the substrate to fill a portion of the trench, forming a protection layer in a remaining portion of the trench, removing an unprotected portion of the first metal layer, removing the protection layer from the trench, and forming a second metal layer over the substrate to fill the remainder trench.

Another one of the broader forms of an embodiment of the invention involves a semiconductor device. The semiconductor device includes a semiconductor substrate, a source and a drain region formed on the semiconductor substrate, and a gate structure disposed on the substrate between the source and drain regions. The gate structure includes an interfacial layer formed over the substrate, a high-k dielectric formed over the interfacial layer, and a metal gate formed over the high-k dielectric that includes a first metal layer and a second metal layer, where the first metal layer is formed on a portion of the sidewalls of the gate structure and where the second metal layer is formed on another portion of the sidewalls of the gate structure.

Yet another one of the broader forms of an embodiment of the invention involves a method for fabricating a semiconductor device. The method includes providing a semiconductor substrate, forming a gate structure on the semiconductor substrate, the gate structure including a high-k dielectric and a dummy polysilicon gate, removing the dummy polysilicon gate to provide a trench in the gate structure, depositing a first metal layer over the substrate to partially fill the trench, forming a photoresist layer on the first metal layer to fill a remainder of the trench, etching back the photoresist layer such that a portion of the photoresist layer protects the metal layer within the trench, removing the unprotected portion of the first metal layer, removing the portion of the photoresist layer from the trench, and depositing a second metal layer over the substrate to fill the trench.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
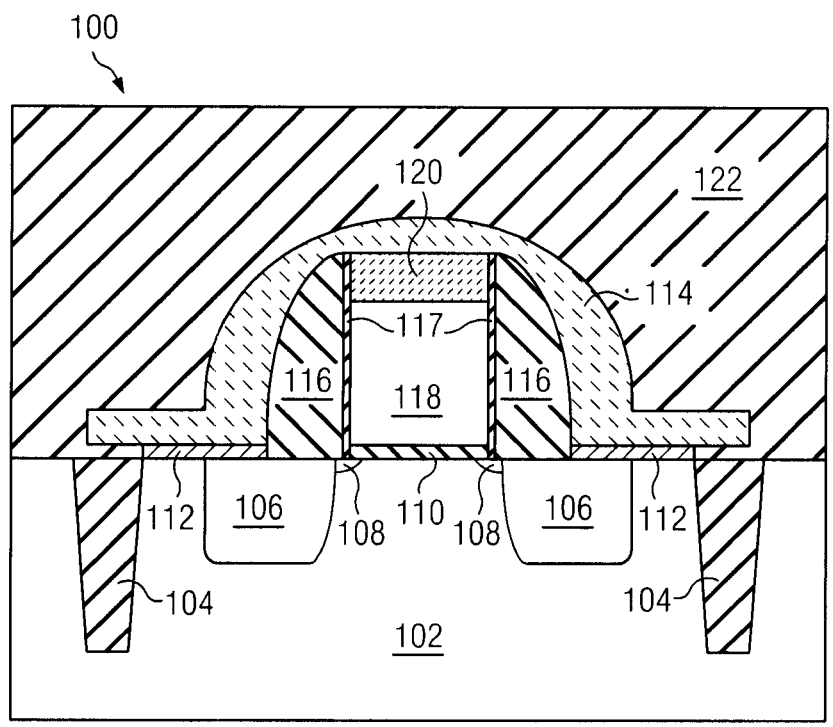
FIGS. 1-3 are cross-sectional views of a semiconductor device at various stages of fabrication in an embodiment of a gate last process.

The present disclosure relates generally to forming an integrated circuit device on a substrate and, more particularly, to fabricating a gate structure as part of an integrated circuit (including FET devices). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however one skilled in the art may recognize applicability to other processes and/or use of other materials.

Figure 2:
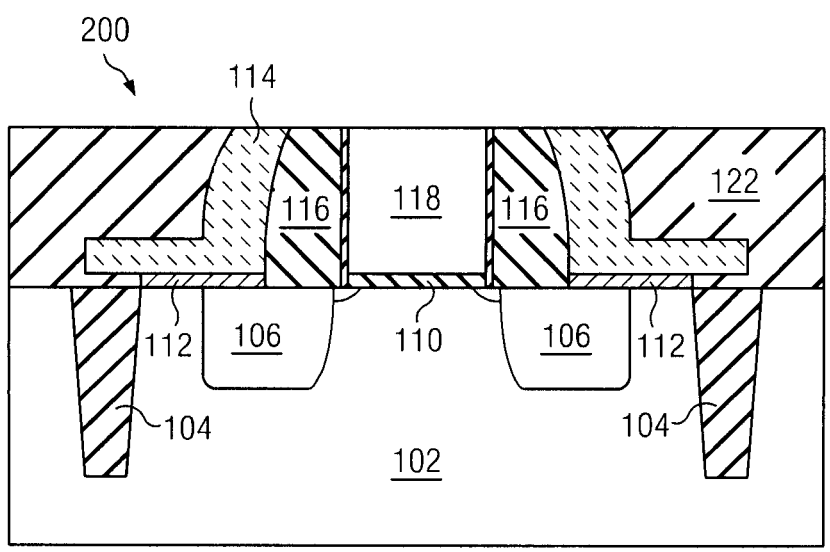
Figure 3:
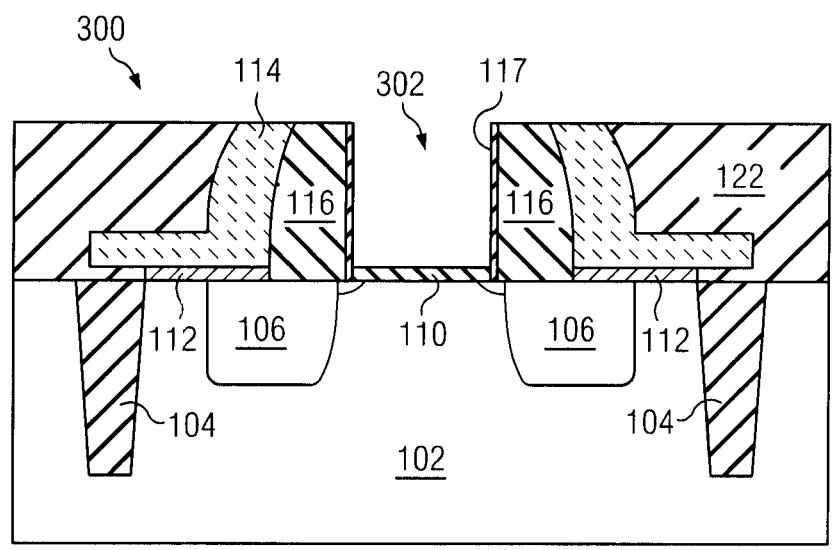

Referring to FIGS. 1, 2, and 3 illustrated are cross-sectional views of a semiconductor device at various stages of fabrication in a gate last process. The various stages of the device are illustrated as device 100, 200, and 300 respectively. One or more features, for example of the device 100, may be included in the devices 200 and 300 and remain substantially unchanged except as noted herein. The devices 100, 200, and 300 may be intermediate devices fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof The semiconductor device 100 includes a substrate 102. Formed on the substrate 102 are shallow trench isolation (STI) structures 104, source/drain regions 106 (including source/drain extension regions 108), a gate dielectric 110, contacts 112, a contact etch stop layer (CESL) 114, spacers 116, a dummy gate pattern 118, hard mask layer 120, and a dielectric layer 122.

In an embodiment, the substrate 102 includes a silicon substrate (e.g., wafer) in crystalline structure. The substrate 102 may include various doping configurations depending on design requirements as is known in the art (e.g., p-type substrate or n-type substrate) Other examples of the substrate 102 may also include other elementary semiconductors such as germanium and diamond. Alternatively, the substrate 102 may include a compound semiconductor such as, silicon carbide, gallium arsenide, indium arsenide, or indium phosphide. Further, the substrate 102 may optionally include an epitaxial layer (epi layer), may be strained for performance enhancement, and/or may include a silicon-on-insulator (SOI) structure.

The shallow trench isolation (STI) features 104 formed in the substrate 102 may isolate one or more devices from each other. The STI features 104 may include silicon oxide, silicon nitride, silicon oxynitride, fluoride-doped silicate glass (FSG), and/or a low k dielectric material. Other isolation methods and/or features are possible in lieu of or in addition to STI. The STI features 104 may be formed using processes such as reactive ion etch (RIE) of the substrate 102 to form trenches which are then filled with insulator material using deposition processes followed by CMP process.

The gate structure formed using the dummy gate pattern 118 may be configured as P-channel or N-channel as is known in the art. The dummy gate pattern 118 is a sacrificial layer. The dummy gate pattern 118 may include polysilicon. In an embodiment, the dummy gate pattern 118 includes amorphous silicon. The dummy gate pattern 118 may be formed by MOS technology processing such as polysilicon deposition, photolithography, etching, and/or other suitable methods.

The gate dielectric 110 may include a high dielectric constant (high-k) material. In an embodiment, the high-k dielectric material includes hafnium oxide ($HfO_2$). Other examples of high-k dielectrics include hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. The semiconductor device 100 may further include, various other dielectric and/or conductive layers, for example, interfacial layers and/or capping layers underlying the dummy gate pattern 118. In an embodiment, a capping layer (e.g., dielectric layer) is formed on the gate dielectric 110. The capping layer may adjust the work function of the subsequently formed metal gate. The capping layer may include a metal oxide (LaOx, MgOx, AlOx), metal alloyed oxide (BaTiOx, SrTiOx, PbZrTiOx), a combination thereof, and/or other suitable materials. In another embodiment, a metal layer is formed on the gate dielectric layer. The overlying metal layer may adjust the work function of the subsequently formed gate.

The spacers 116 may be formed on both sidewalls of the dummy gate structure 118. The spacers 116 may be formed of silicon oxide, silicon nitride, silicon oxynitride, silicon carbide, fluoride-doped silicate glass (FSG), a low k dielectric material, combinations thereof, and/or other suitable material. The spacers 116 may have a multiple layer structure, for example, including one or more liner layers such as liner layer 117. The liner layer 117 may include a dielectric material such as silicon oxide, silicon nitride, and/or other suitable materials. The spacers 116 may be formed by methods including deposition of suitable dielectric material and anisotropically etching the material to form the spacer 116 profile.

The hard mask layer 120 may include silicon nitride, silicon oxynitride, silicon carbide, and/or other suitable materials. The hard mask layer 120 may be formed using methods such as chemical vapor deposition (CVD), physical vapor deposition (PVD), or atomic layer deposition (ALD). In an embodiment, the hard mask layer 120 is between approximately 100 and 500 angstroms in thickness.

The source/drain regions 106 including lightly doped source/drain regions shown as regions 108 and heavy doped source/drain regions, are formed on the substrate 102. The source/drain regions 106 may be formed by implanting p-type or n-type dopants or impurities into the substrate 102 depending on the desired transistor configuration. The source/drain features 106 may be formed by methods including photolithography, ion implantation, diffusion, and/or other suitable processes. The contact features 112, coupled to the source/drain regions 106, may include silicide. The contact features 112 may be formed on the source/drain regions 106 by a salicide (self-aligned silicide) process. The contacts 112 may include nickel silicide, cobalt silicide, tungsten silicide, tantalum silicide, titanium silicide, platinum silicide, erbium silicide, palladium silicide, or combinations thereof. The contact etch stop layer (CESL) 114 may be formed of silicon nitride, silicon oxynitride, and/or other suitable materials. The CESL 114 composition may be selected based upon etching selectivity to one or more additional features of the semiconductor device 100.

A dielectric layer 122 such as an inter-layer (or level) dielectric (ILD) layer may be formed overlying the CESL 114 by chemical vapor deposition (CVD), high density plasma CVD, spin-on, sputtering, or other suitable methods. The dielectric layer 122 may include silicon oxide, silicon oxynitride, or a low k material. In an embodiment, the dielectric layer 122 is a high density plasma (HDP) dielectric.

In a gate last process, the dummy gate structure 118 may be removed so that a resulting metal gate structure may be formed in place of the dummy gate structure 118. Accordingly, the dielectric layer 122 may be planarized by a chemical mechanical polishing (CMP) process until a top portion of the dummy gate structure 118 is reached as illustrated by the device 200 of FIG. 2. Following the planarization, the dummy gate structure 118 may be removed, providing the device 300 of FIG. 3. For example, polysilicon is selectively etched removing the dummy gate structure 118. The selective removal of the dummy gate structure 118 provides a trench 302 within which a metal gate may be formed. The dummy gate structure 118 may be removed using a wet etch and/or a dry etch. In an embodiment, a wet etch process includes exposure to a hydroxide containing solution (e.g., ammonium hydroxide), deionized water, and/or other suitable etchant solutions.

Figure 4:
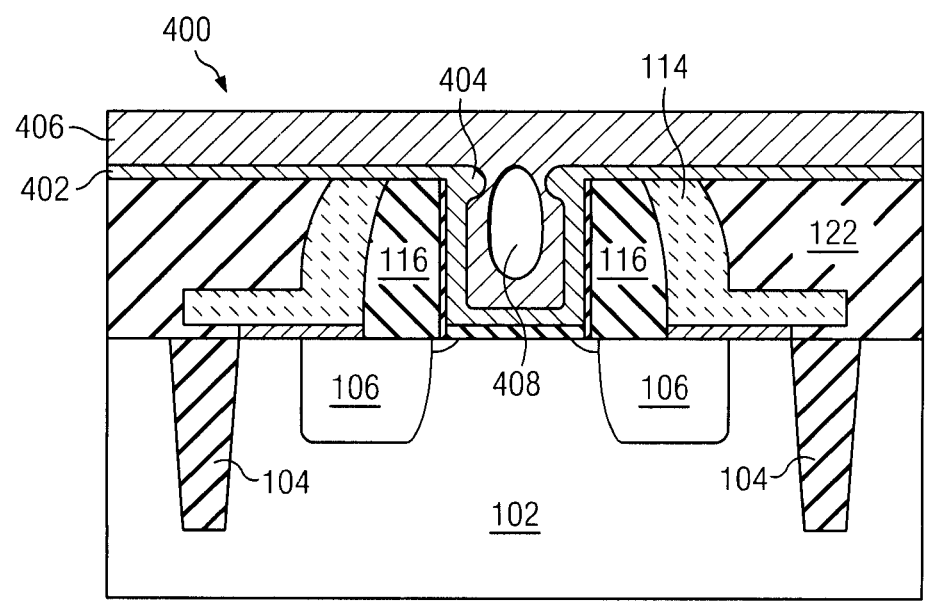
FIGS. 4 and 5 are cross-sectional views of a semiconductor device during metal deposition processes of an embodiment of a gate last process.
Figure 5:
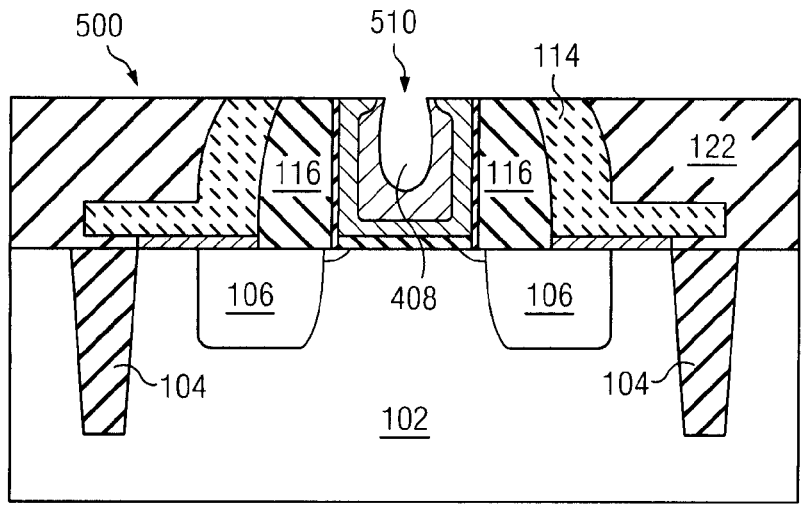

Referring now to FIGS. 4 and 5, an embodiment of formation of a metal gate is illustrated. FIG. 4 illustrates a device 400 including metal gate materials deposited into the trench 302. The metal gate materials may include one or more layers of material such as, liners, materials to provide appropriate work function of the gate, gate electrode materials, and/or other suitable materials. However, it has been observed that deposition of one or more layers required for the metal gate formation may provide incomplete filling of the trench 302. For example, a deposition of a first metal 402 such as a metal liner and/or work function metal may provide an overhang 404 at the aperture of the trench 302. The overhang 404 may result from the difficulties in filling a high aspect ratio trench. The subsequent deposition of metal layer 406 may form one or more voids such as, void 408, in the trench 302.

Referring now to FIG. 5, a chemical mechanical polish (CMP) process is performed on the device 400 to provide the device 500 and form the metal gate 502. The device 500 illustrates the metal gate 502 formed with the void 408. Accordingly, the void may increase a resistance (e.g. Rs) of the device. Though further CMP processing may reduce the void 408, for example, by reducing the gate height, this may cause other issues such as decrease of stress on the channel (e.g., disadvantageous reduction of stress for a strained device) and/or the performance of the transistor may be degraded. Therefore, FIGS. 4 and 5 illustrate disadvantages of a gate last process where the aspect ratio of a resultant trench provides for difficult deposition of material to partially or completely fill the trench.

Figure 6:
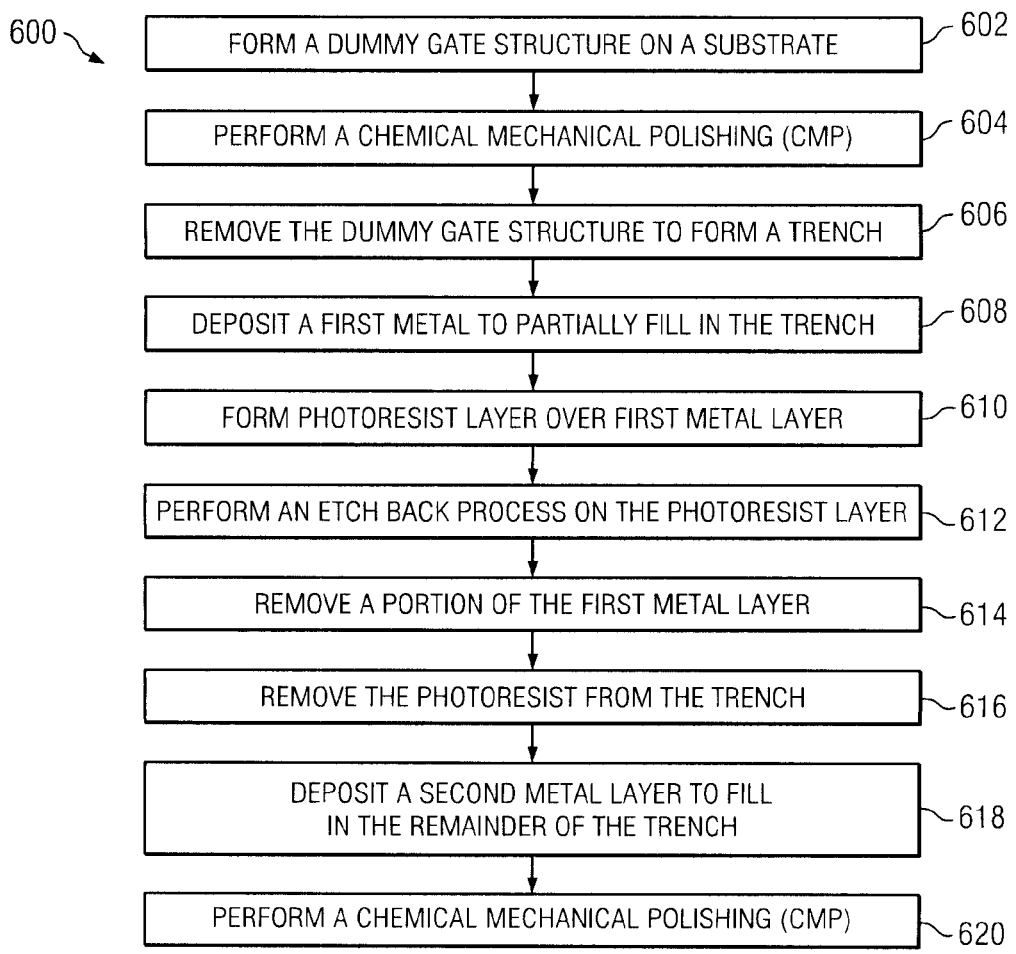
FIG. 6 is a flowchart of an embodiment of a method of forming a gate including a gate last process according to various aspects of the present disclosure.

Referring now to FIG. 6, illustrated is a method 600 for fabricating a semiconductor device including the formation of a metal gate by a "gate last" process. Referring also to FIGS. 7-15 illustrated are cross-sectional views of a semiconductor device 700 at various stages of fabrication according to the method 600 FIG. 6. The semiconductor device 700 is similar to the semiconductor devices 100, 200, 300 of FIGS. 1-3. Accordingly, similar features in FIGS. 1-3 and 7-15 are numbered the same for the sake of simplicity and clarity.

Figure 7:
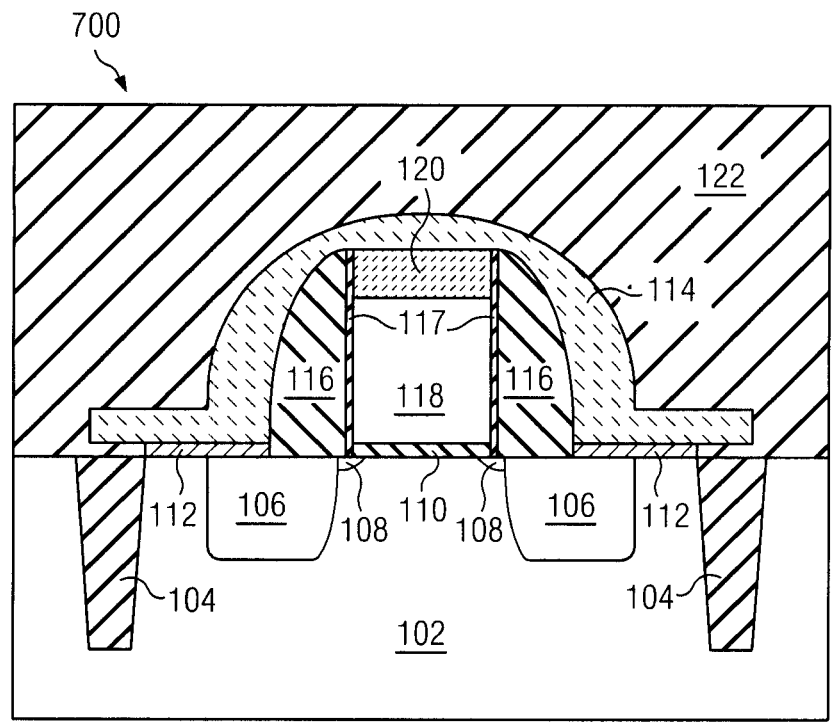
FIGS. 7-15 are cross-sectional views of a semiconductor device of at various stages of fabrication according to the method of FIG. 6.

The method 600 begins at step 602 where a semiconductor device including a transistor structure is formed. The transistor structure includes a dummy gate structure 118. The dummy gate structure 118 may include a dummy polysilicon gate structure. In FIG. 7, the semiconductor device 700 formed may be substantially similar to the device 100, described above with reference to FIG. 1.

The gate dielectric 110 may include a high dielectric constant (high-k) material. In an embodiment, the high-k dielectric material includes hafnium oxide ($HfO_2$). Other examples of HK dielectrics include hafnium silicon oxide (HfSiO), hafnium silicon oxynitride (HfSiON), hafnium tantalum oxide (HMO), hafnium titanium oxide (HfTiO), hafnium zirconium oxide (HfZrO), combinations thereof, and/or other suitable materials. The semiconductor device 100 may further include, various other dielectric and/or conductive layers, for example, interfacial layers and/or capping layers underlying the dummy gate pattern 118.

Figure 8:
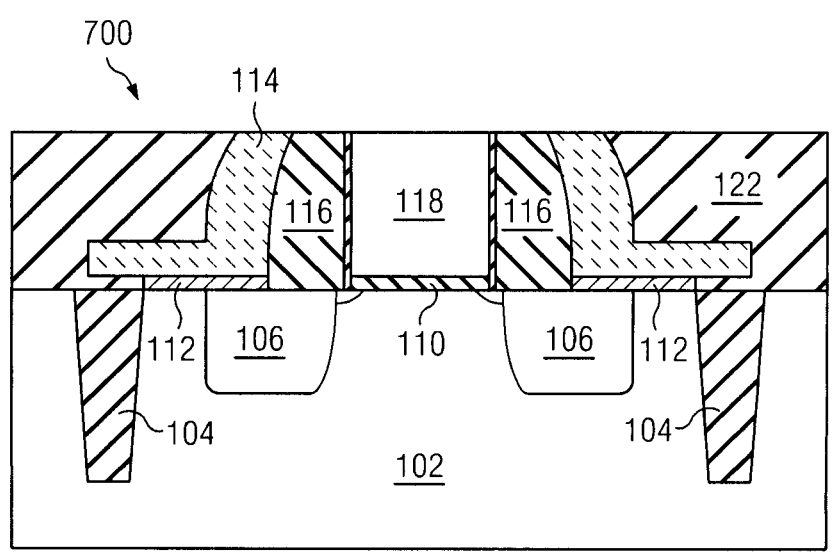

The method 600 proceeds to step 604 where a chemical mechanical polishing (CMP) process is performed. In FIG. 8, the CMP process may planarize the device 700 and expose the dummy gate structure 118. The resultant device 700 may be substantially similar to the device 200, illustrated above with reference to FIG. 2.

Figure 9:
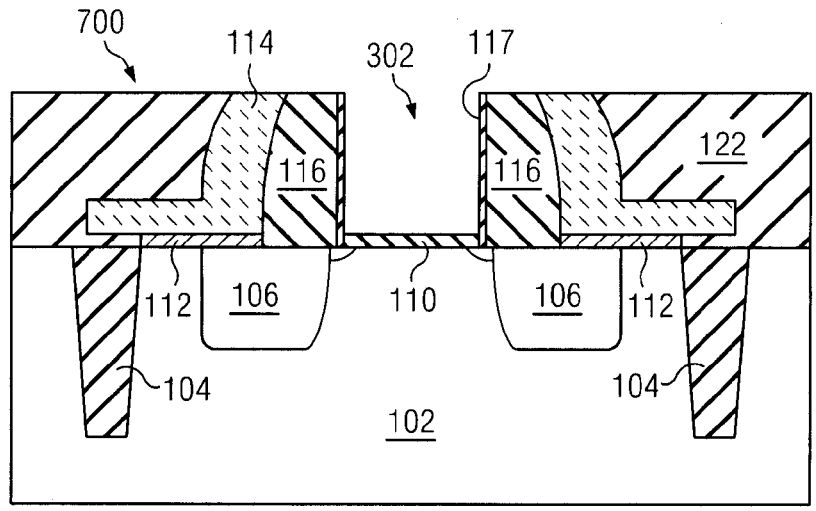

The method 600 proceeds to step 606 where the dummy gate structure is removed. In FIG. 9, the removal of the dummy gate structure 118 may provide for a trench 302 (e.g., aperture in the substrate) within which a metal gate may be formed. The sidewalls and bottom of the trench 302 may be coated with a liner layer 117. In an embodiment, the liner layer 117 may be $SiO_2$, SiN, SiON, and/or other suitable material. The liner layer 117 may be included in a spacer feature.

Figure 10:
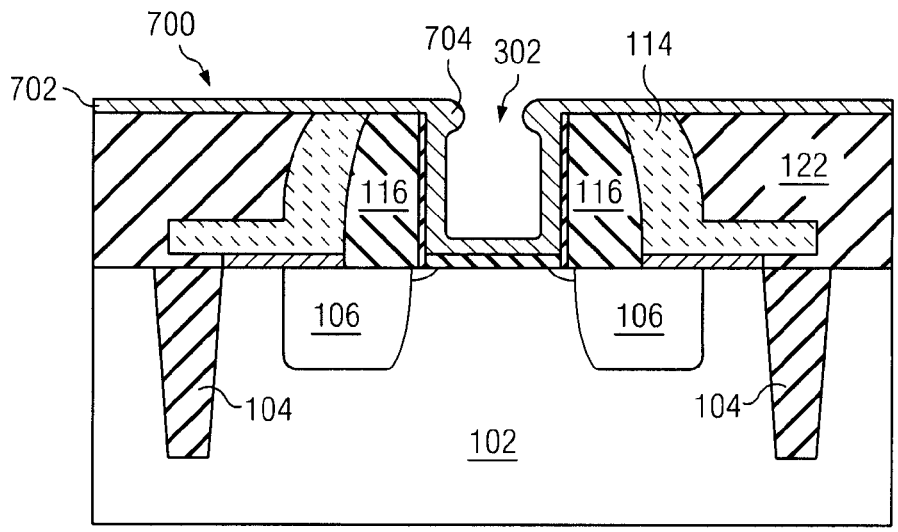

The method 600 proceeds to step 608 where a first metal layer is deposited to partially fill in the trench. In FIG. 10, the metal layer 702 deposited may be any metal material suitable for forming a metal gate or portion thereof, including work function layers, liner layers, interface layers, seed layers, adhesion layers, barrier layers, etc. The metal layer 702 may include one or more layers including Ti, TiN, TaN, Ta, TaC, TaSiN, W, WN, MoN, MoON, and/or other suitable materials. The metal layer 702 may be formed by PVD or other suitable processes. Examples of metals that may be deposited include P-type metal materials and N-type metal materials. P-type metal materials may include compositions such as ruthenium, palladium, platinum, cobalt, nickel, and conductive metal oxides, and/or other suitable materials. N-type metal materials may include compositions such as hafnium, zirconium, titanium, tantalum, aluminum, metal carbides (e.g., hafnium carbide, zirconium carbide, titanium carbide, aluminum carbide), aluminides, and/or other suitable materials. The deposition of the metal layer 702 may provide an overhang 704 at the aperture of the trench 302. The overhang 704 may result from the difficulties in filling a high aspect ratio trench.

Figure 11:
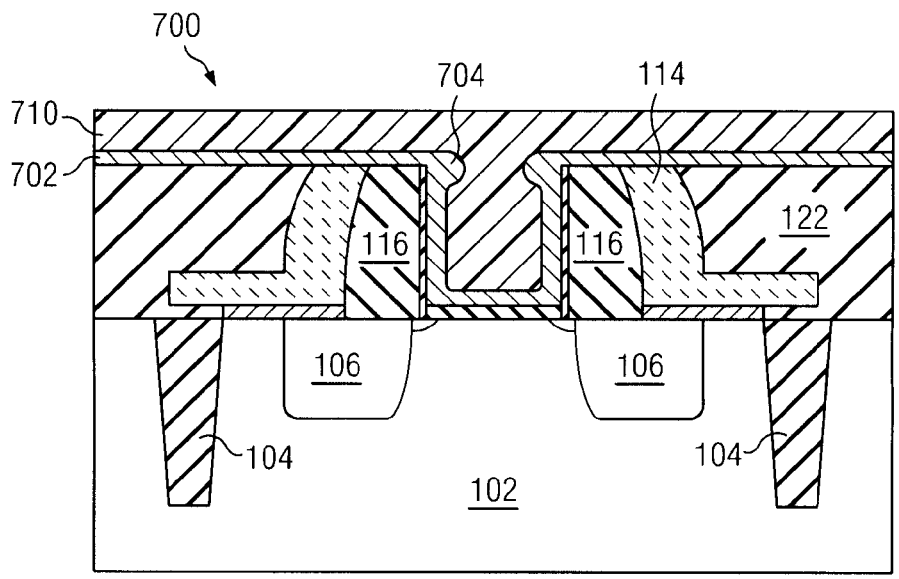

The method 600 proceeds to step 610 where a photoresist layer is formed over the first metal layer. In FIG. 11, the photoresist layer 710 may be formed on the metal layer 702 by a spin-coating process. Accordingly, the photoresist layer 710 is able to fill in the remainder of the trench 302 even with the presence of the overhang 704. Further, a soft-bake process may be performed on the photoresist layer 710 to evaporate the solvent from the photoresist layer 710.

Figure 12:
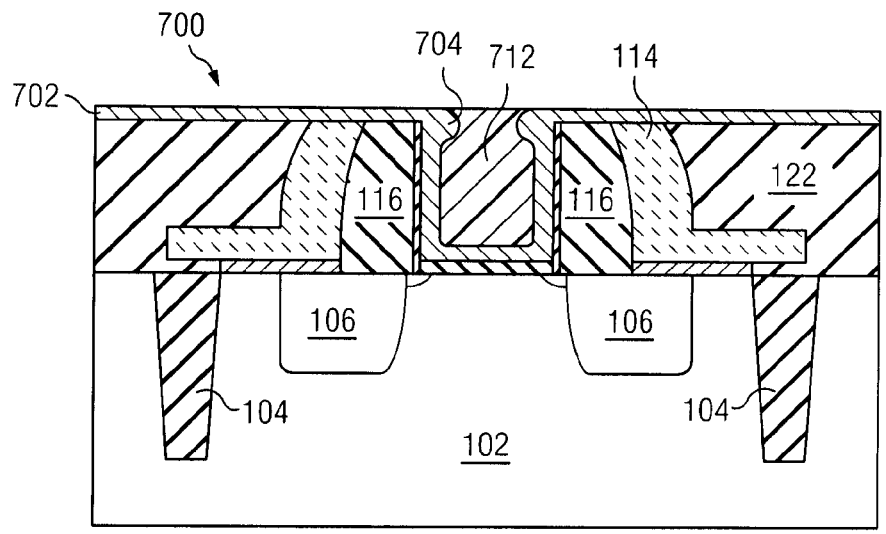

The method 600 proceeds to step 612 where an etch back process is performed on the photoresist layer. In FIG. 12, a photoresist etch back process may be performed to remove a portion of the photoresist layer 710 and the process may stop at the metal layer 702. Accordingly, a photoresist layer 712 still remains in the trench 302 to protect the metal layer 702 within the trench. It should be noted that the photoresist layer 710 is not patterned by exposure but used for the etch back process.

Figure 13:
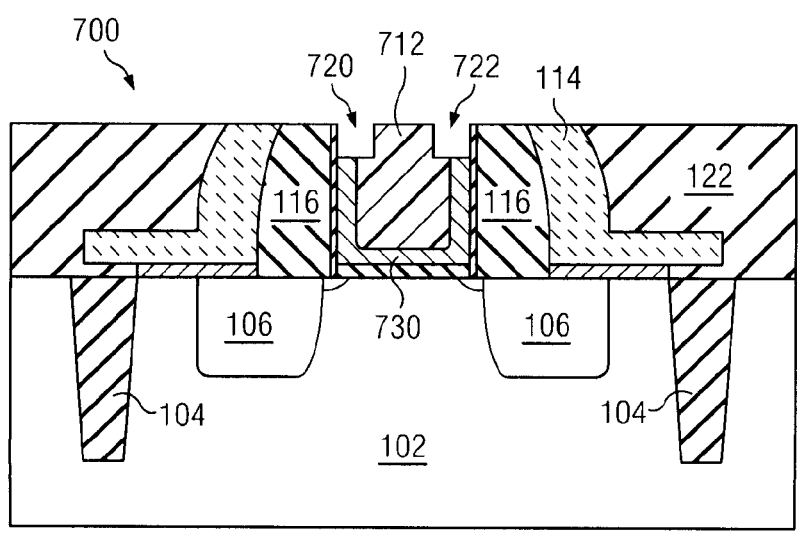

The method 600 proceeds to step 614 where an etch process is performed to remove a portion of the first metal layer. In FIG. 13, the etch process may include a wet etch process that selectively removes portions of the metal layer 702 (e.g., work function metal pull back) that are not protected by the photoresist layer 712. The overhang 704 and portions 720, 722 of the metal layer 702 at the aperture of the trench 302 may be removed the etch process. Thus, a metal layer 730 (work function metal) still remains at the bottom and on part of the sidewalls of the trench 302.

The method 600 proceeds to step 616 where the photoresist layer is removed from the trench 302. The photoresist layer 712 remaining in the trench 302 may be removed by an etch process or other suitable process. For example, a developer may be used to remove the photoresist layer 712 since the photoresist layer (e.g., negative type photoresist) has not been exposed, and thus can be dissolved by the developer.

Figure 14:
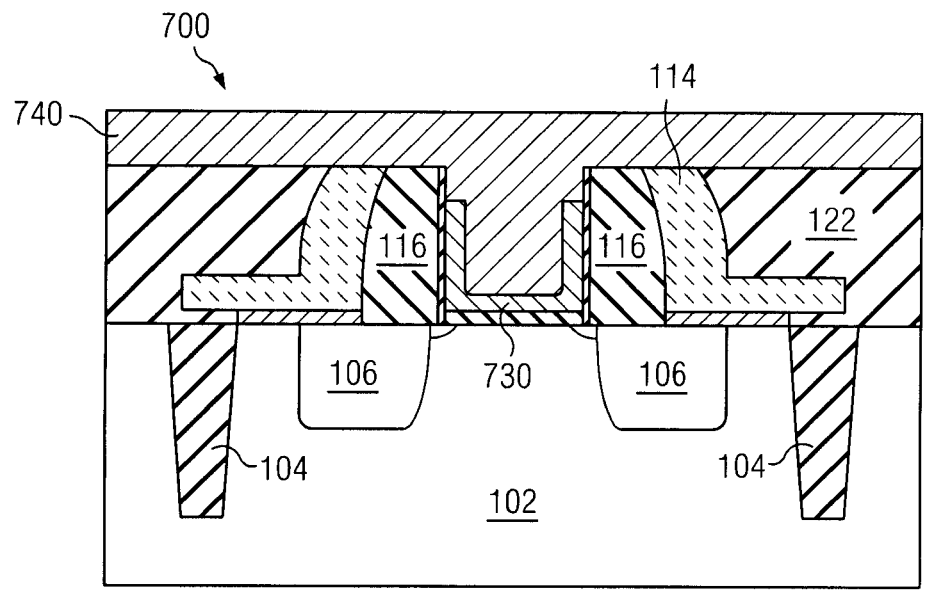

The method 600 proceeds to step 618 where a second metal layer is deposited to fill in the remainder of the trench. In FIG. 14, a fill metal layer 740 may be deposited to substantially or completely fill in the remainder of the trench 302 including the work function metal 730. The fill metal layer 740 may include, tungsten (W), aluminum (Al), titanium (Ti), titanium nitride (TiN), tantalum (Ta), tantalum nitride (TaN), cobalt (Co), copper (Cu), nickel (Ni), combinations thereof, and/or other suitable materials. The fill metal layer 740 may be deposited using CVD, PVD, plating, and/or other suitable processes. It should be noted that some of the fill metal layer 740 may be formed on the sidewall of the trench 302 at the top surface. Accordingly, the metal gate structure may include a length (measured along the channel length) that is greater at a top surface (away from the substrate) as compared to a length at a bottom surface (near the substrate).

Figure 15:
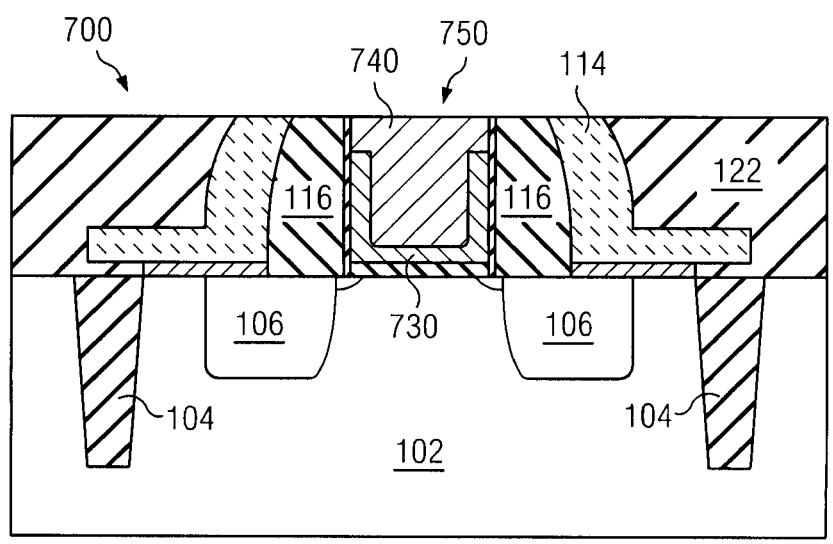

The method 600 then proceeds to step 620 where a chemical mechanical polish (CMP) process is performed. In FIG. 15, the CMP process planarizes the semiconductor device 700. The planarization may remove the fill metal layer 740 deposited outside of the trench structure 302. The CMP process provides the semiconductor device 700 with a metal gate structure 750. Further, the metal gate structure 750 may be substantially free of voids. The gate structure may include the work function metal 712, the gate fill metal material 740, and the gate dielectric layer 110 (including an interfacial layer and capping layer).

In embodiments, the method 600 may continue to include process steps such as deposition of passivation layers, formation of contacts, interconnect structures (e.g., lines and vias, metal layers, and interlayer dielectric that provide electrical interconnection to the device including the formed metal gate).

Thus, the method 600 and the semiconductor device 700 illustrated in FIGS. 7-15 may provide for improved formation of the metal gate for example, including minimizing and/or eliminating the formation of voids such as provided by the semiconductor devices 400 and 500 illustrated in FIGS. 4 and 5 respectively. Accordingly, device performance and reliability is improved with the method 600.

In summary, a gate last process may be implemented to form metal gate structures. Problems with forming the metal gate structure may be reduced by removing the overhang of a metal film at the aperture (e.g., top opening) of the trench prior to depositing a metal filler layer in the trench. In particular, a photoresist etch back process may be performed to protect the underlying metal film in the trench. The overhang and other portions of the metal film that are not protected by the photoresist may be removed by a etch process. Accordingly, a subsequent metal filler layer that is deposited may easily fill in the trench completely to form the metal gate structure. Thus, the risk of forming voids in the metal gate structure is reduced and/or eliminated even as device features continue to shrink in advanced technology nodes (e.g., 45 nm and below). Further, a height of the gate is precisely controlled by the methods disclosed herein without having to overpolish (by CMP) to remove the overhang and decrease the poly gate height. It is understood that the embodiments disclosed herein offer different advantages, and that no particular advantage is necessarily required for all embodiments.

Accordingly, the present disclosure provides a device and method that includes a modified trench structure that prevents or reduces the risk of incomplete formation of a metal gate in a gate-last process. While the preceding description shows and describes one or more embodiments, it will be understood by those skilled in the art that various changes in form and detail may be made therein without departing from the spirit and scope of the present disclosure. For example, although the methods implements a "gate last" approach, the methods disclosed herein may be used in a hybrid process in which one type of metal gate is formed in a "gate first" process and the other type of metal gate is formed in a "gate last" process. Further, although a photoresist material is disclosed herein to protect the bottom metal in the trench, it has been contemplated that other polymeric materials may be used since an exposure process is not required for the etch back process. Therefore, the claims should be interpreted in a broad manner, consistent with the present disclosure.

What is claimed is:

1. A semiconductor device, comprising:
   a semiconductor substrate;
   a source and a drain region formed on the semiconductor substrate; and
   a gate structure disposed on the substrate between the source and drain regions, the gate structure including:
      an interfacial layer formed over the substrate;
      a high-k dielectric formed over the interfacial layer; and
      a metal gate element formed over the high-k dielectric wherein the metal gate element includes a first linear sidewall substantially perpendicular a top surface of the semiconductor substrate and an opposing second linear sidewall substantially perpendicular the top surface of the semiconductor substrate, wherein the first linear sidewall and the second linear sidewall extend to a top surface that is co-planar with a top surface of a spacer element abutting the gate structure and wherein the metal gate element includes:
         a first metal layer and a second metal layer, wherein the first metal layer provides a work function for the metal gate element and defines a first portion of the first linear sidewall and a first portion of the second linear sidewall and wherein the second metal layer defines a second portion of the first linear sidewall and a second portion of the second linear sidewall, wherein the second metal layer is a non-silicide fill metal including copper, wherein a liner layer of the spacer element directly interfaces with the first metal layer and the second metal layer; and
      wherein the metal gate element has a length at a top surface that is greater than a length at the bottom surface, the bottom surface being closer to the substrate than the top surface, wherein the lengths are measured along a channel length.

2. The semiconductor device of claim 1, wherein the high-k dielectric includes $HfO_2$, HfSiO, HfSiON, HfTaO, HfTiO, HfZrO, or combinations thereof.

3. The semiconductor device of claim 1, further comprising a capping layer formed between the high-k dielectric and metal gate.

4. The semiconductor device of claim 1, wherein the first metal layer includes Ti, TiN, TaN, Ta, TaC, TaSiN, W, WN, MoN, MoON, or combinations thereof.

5. The semiconductor device of claim 1, wherein the first metal layer includes at least one of a P-type work function metal or an N-type work function metal.

6. The semiconductor device of claim 1, wherein the first metal layer is a work function metal layer.

7. The semiconductor device of claim 1, wherein the top surface of the spacer element has a length less than an opposing bottom surface of the spacer element.

8. The semiconductor device of claim 1, wherein the spacer element includes a liner layer.

9. The semiconductor device of claim 1, wherein the gate structure fills a trench surrounded by dielectric material.

10. The semiconductor device of claim 1, wherein the first and second linear sidewalls define a gate structure of only one of an NFET and an PFET device.

11. A semiconductor device, comprising:
    a semiconductor substrate;
    a spacer having a liner formed on the semiconductor substrate, wherein the spacer defines an opening having a first sidewall that is linear and substantially perpendicular a top surface of the semiconductor substrate and a second sidewall that is linear and opposing and substantially parallel the first sidewall;

a metal gate electrode disposed on the substrate and in the opening, the metal gate electrode including:

a gate dielectric layer form in opening;

a work function metal layer disposed on the gate dielectric layer wherein the work function metal layer directly interfaces with the first and second sidewalls; and a fill metal layer disposed on the work function metal layer, wherein the fill metal layer directly interfaces with the first and second sidewalls, and wherein the fill metal layer is copper (Cu), wherein the fill metal layer has a length at a top surface that is greater than a length at the bottom surface, the bottom surface being closer to the substrate than the top surface, wherein the lengths are measured along a channel length.

12. The semiconductor device of claim 11, further comprising:

a source region and a drain region adjacent the gate structure.

13. The semiconductor device of claim 11, wherein the gate dielectric includes a high-k dielectric material.

14. The semiconductor device of claim 11, wherein the fill metal layer directly interfaces with the first and second sidewalls at an upper portion of the first sidewall and an upper portion of the second sidewall.

15. The semiconductor device of claim 14, wherein the work function metal layer directly interfaces with the first and second sidewalls at a lower portion of the first sidewall and a lower portion of the second sidewall.

16. The semiconductor device of claim 11, wherein the opening is confined to one of an NFET region and a PFET region of the semiconductor substrate.

17. A semiconductor device, comprising:

one of an n-type and a p-type a transistor formed on a semiconductor substrate, wherein the transistor includes a source and a drain region formed on the semiconductor substrate and a gate structure disposed on the substrate between the source and drain regions and in an opening defined by dielectric material, at least two sidewalls of the gate structure directly interface a liner layer of spacers, and wherein the gate structure fills the opening and includes:

an interfacial layer formed over the substrate interposing the spacers;

a high-k dielectric formed over the interfacial layer and interposing the spacers; and a metal gate structure formed over the high-k dielectric and having substantially linear sidewalls, wherein the metal gate structure includes a first metal work function layer and a fill metal layer formed on the first metal layer, wherein the fill metal copper layer has a top surface and an opposing and parallel bottom surface, wherein the bottom surface interfaces directly with the first metal layer, and wherein the top surface is longer than the bottom surface.

18. The device of claim 17, wherein the top surface of the fill metal layer extends from a first lateral sidewall to an opposing second lateral sidewall of the gate structure.

19. The device of claim 17, wherein the gate structure further comprises a capping layer.

* * * * *